US009041106B2

(12) United States Patent
Cappellani et al.

(10) Patent No.: US 9,041,106 B2
(45) Date of Patent: May 26, 2015

(54) THREE-DIMENSIONAL GERMANIUM-BASED SEMICONDUCTOR DEVICES FORMED ON GLOBALLY OR LOCALLY ISOLATED SUBSTRATES

(71) Applicants: Annalisa Cappellani, Portland, OR (US); Pragyansri Pathi, Porland, OR (US); Bruce E. Beattie, Portland, OR (US); Abhijit Jayant Pethe, Hillsboro, OR (US)

(72) Inventors: Annalisa Cappellani, Portland, OR (US); Pragyansri Pathi, Porland, OR (US); Bruce E. Beattie, Portland, OR (US); Abhijit Jayant Pethe, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 285 days.

(21) Appl. No.: 13/629,141

(22) Filed: Sep. 27, 2012

(65) Prior Publication Data

US 2014/0084370 A1 Mar. 27, 2014

(51) Int. Cl.
*H01L 27/12* (2006.01)
*H01L 29/786* (2006.01)
*H01L 29/66* (2006.01)

(52) U.S. Cl.
CPC ........ *H01L 29/786* (2013.01); *H01L 29/66795* (2013.01)

(58) Field of Classification Search
CPC ............ H01L 21/845; H01L 21/02532; H01L 27/1211; H01L 27/0886; H01L 27/0924; H01L 29/66795; H01L 29/785; H01L 29/775; H01L 29/0673; H01L 29/78; H01L 29/42392; H01L 29/7869; H01L 29/786
USPC .......................... 257/347, E29.295, E21.411
See application file for complete search history.

(56) References Cited

U.S. PATENT DOCUMENTS 7,829,916 B2 * 11/2010 Morand et al. ................ 257/192
2008/0135949 A1 6/2008 Lo et al.

(Continued)

FOREIGN PATENT DOCUMENTS

| | | |
|---|---|---|
| KR | 20050099324 | 10/2005 |
| KR | 20090075534 | 7/2009 |
| TW | 201236087 | 9/2012 |

OTHER PUBLICATIONS

International Search Report and Written Opinion for PCT Patent Application No. PCT/US2013/044806, mailed Nov. 20, 2013, 12 pgs.

(Continued)

*Primary Examiner* — Khiem D Nguyen

(74) *Attorney, Agent, or Firm* — Blakely, Sokoloff, Taylor & Zafman LLP

(57) ABSTRACT

Three-dimensional germanium-based semiconductor devices formed on globally or locally isolated substrates are described. For example, a semiconductor device includes a semiconductor substrate. An insulating structure is disposed above the semiconductor substrate. A three-dimensional germanium-containing body is disposed on a semiconductor release layer disposed on the insulating structure. The three-dimensional germanium-containing body includes a channel region and source/drain regions on either side of the channel region. The semiconductor release layer is under the source/drain regions but not under the channel region. The semiconductor release layer is composed of a semiconductor material different from the three-dimensional germanium-containing body. A gate electrode stack surrounds the channel region with a portion disposed on the insulating structure and laterally adjacent to the semiconductor release layer.

24 Claims, 13 Drawing Sheets

205B'
240
260
232
265
265
260
202
205A'
OXIDIZED PORTION OF 202

(56) References Cited

U.S. PATENT DOCUMENTS

| | | | | |
|---|---|---|---|---|
| 2008/0242075 | A1* | 10/2008 | Oh et al. | 438/594 |
| 2009/0072279 | A1 | 3/2009 | Moselund et al. | |
| 2011/0012090 | A1* | 1/2011 | Singh et al. | 257/24 |
| 2011/0291190 | A1* | 12/2011 | Xiao et al. | 257/347 |

OTHER PUBLICATIONS

Search Report from Taiwan Patent Application No. 102133467, mailed on Feb. 11, 2015, 1 pg.

* cited by examiner

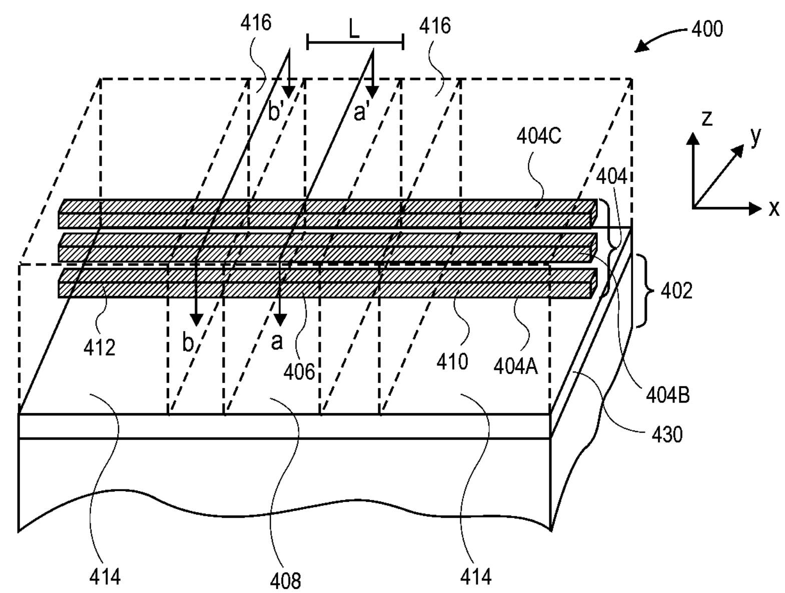
FIG. 4A
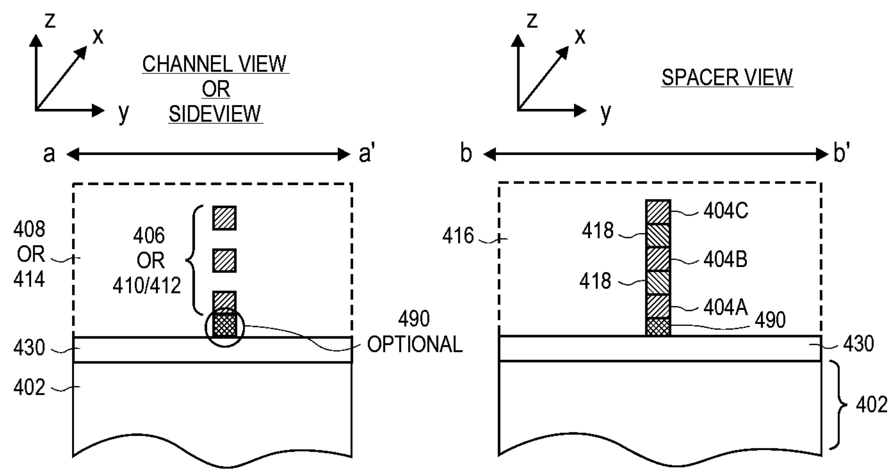
FIG. 4B
FIG. 4C

THREE-DIMENSIONAL GERMANIUM-BASED SEMICONDUCTOR DEVICES FORMED ON GLOBALLY OR LOCALLY ISOLATED SUBSTRATES

TECHNICAL FIELD

Embodiments of the invention are in the field of semiconductor devices and, in particular, three-dimensional germanium-based semiconductor devices formed on globally or locally isolated substrates.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Silicon-on-insulator substrates, formed either by global isolation or local isolation, may also be used to fabricate gate-all-around devices. Many different techniques have been attempted to fabricate such three-dimensional isolated channel devices. However, significant improvements are still needed in the area of isolation formation for such semiconductor devices.

In another aspect, many different techniques have been attempted to improve the mobility of transistors. However, significant improvements are still needed in the area of electron and/or hole mobility improvement for semiconductor devices.

BRIEF DESCRIPTION OF THE DRAWINGS

FIG. 4A illustrates a three-dimensional cross-sectional view of a nanowire-based semiconductor structure, in accordance with an embodiment of the present invention.

FIG. 4B illustrates a cross-sectional channel view of the nanowire-based semiconductor structure of FIG. 4A, as taken along the a-a' axis, in accordance with an embodiment of the present invention.

FIG. 4C illustrates a cross-sectional spacer view of the nanowire-based semiconductor structure of FIG. 4A, as taken along the b-b' axis, in accordance with an embodiment of the present invention.

DESCRIPTION OF THE EMBODIMENTS

Figure 1A:
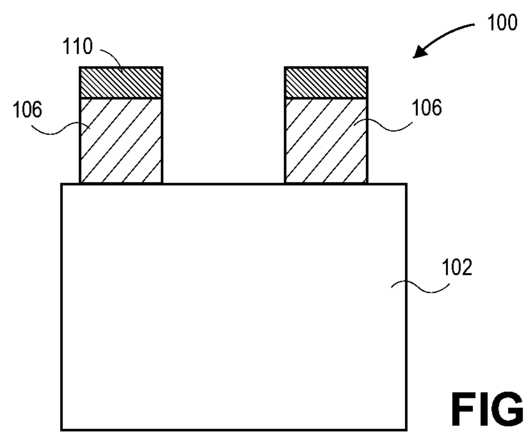
FIGS. 1A-1K illustrate cross-sectional views of various operations in a method of fabricating a semiconductor device, in accordance with an embodiment of the present invention.

Three-dimensional germanium-based semiconductor devices formed on globally or locally isolated substrates are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to the integration of silicon germanium (SiGe) or germanium (Ge) three-dimensional body structures (e.g., FINs) on isolated substrates. For example, such three-dimensional germanium-containing semiconductor bodies may be fabricated above, but isolated from, an underlying bulk substrate by using a silicon-on-insulator (SOI) or an under-fin-oxidation (UFO) approach. The germanium-containing semiconductor bodies may be essentially entirely composed of germanium, or may be substantially composed of germanium. In an embodiment, a germanium-containing semiconductor body is composed of at least 50% germanium, such as in $Si_xGe_y$ (y>0.5), and possibly greater than 70% germanium. In other embodiments, the germanium-containing semiconductor body is composed of at least 98% germanium. In an embodiment, the germanium-containing semiconductor body is suitable or optimal for hole carrier mobility, e.g., as in PMOS type semiconductor devices.

Process flows described herein may be applicable to tri-Gate and FIN-FET transistors for, e.g., 14 nanometer node and smaller device generations. One or more embodiments involve deposition of a SiGe or Ge FIN (e.g., a germanium-containing FIN) on a silicon (Si) buffer or release layer and selectively removing the Si buffer or release layer in subsequent processing to enable fabrication of a SiGe or Ge FIN gate-all-around or contact-all-around structure or device. An additional Si buffer may also be deposited on the top of the FIN as well if needed to act a protective top layer and, subsequently, may be selectively removed. Not all portions of the Si release or buffer layer are necessarily removed from underneath the germanium-containing semiconductor body, e.g., portions may remain under gate spacers.

In general, one or more embodiments are directed at fabricating SiGe or Ge material channels in a FIN structure. It may be advantageous to have a SiGe or Ge FIN on an $SiO_2$ substrate in order for taking advantage of fully undoped channels (e.g., with no subFIN leakage) and minimized gate induced drain leakage (GIDL) or junction leakage. However, SiGe or Ge may not be grown epitaxially on $SiO_2$ (e.g., to form an SOI-like substrate). Furthermore, under fin oxidation approaches may have to be performed with care taken to avoid having a formed oxide coming in contact with the SiGe or Ge. Such contact may otherwise induce SiGe condensation (e.g., Ge % non-uniformity), the generation of $GeO_2$ or GeO, both very poor oxides with respect to transistor performance.

Embodiments described herein can involve deposition of SiGe or Ge over a Si buffer layer (if from an SOI substrate) or over an Si wafer (if EPI substrate+UFO) and subsequent removal of the Si layer with a selective Si etch process. Such approaches enable the opportunity to fabricate gate-all-around FIN structures in the gate and/or a contact-all-around structure in the source and drain regions (S/D).

A variety of approaches may be used to fabricate three-dimensional germanium-based semiconductor devices formed on globally or locally isolated substrates. For example, in FIGS. 3A-3G describe below, an intervening insulating layer has already been formed prior to formation of a germanium-containing semiconductor body layer. In other embodiments, such as the case for the process schemes described in association with FIGS. 1A-1K and 2A-2K below, an intervening insulating layer is formed subsequent to germanium-containing semiconductor body formation. Thus, one or more embodiments of the present invention are directed to a plurality of semiconductor devices having three-dimensional germanium-containing bodies or active regions (e.g., FINs) formed above a bulk substrate, such as a bulk single crystalline silicon substrate. One or more of the plurality of devices is subjected to an under fin oxidation (UFO, described in greater detail below) process to isolate, or at least restrict, the device from the underlying bulk substrate. Accordingly, one or more embodiments include fabrication processes using a selective (versus global) UFO process to provide selective substrate isolation for targeted devices. However, other embodiments are directed to a plurality of semiconductor devices having three-dimensional germanium-containing bodies or active regions formed on a globally insulating substrate.

Furthermore, in some embodiments, such as the case for the process schemes described in association with FIGS. 1A-1K, 2A-2K and 3A-3G below, a gate electrode is fabricated following release of a portion of a germanium-containing semiconductor body layer, enabling formation of, e.g., gate-all-around semiconductor devices. Thus, focusing on a gate-all-around aspect of embodiments and/or contact-all-around aspect of embodiments of the present invention, different approaches are available to provide a gate surrounding a channel region or a contact surrounding a source/drain region, or both. Also, the gate-all-around and contact-all-around structure is expected to improve short channel performance and transistor contact resistance (e.g., reduce Rexternal). As such, high performance, low leakage transistor technology approaches are described herein.

Figure 1B:
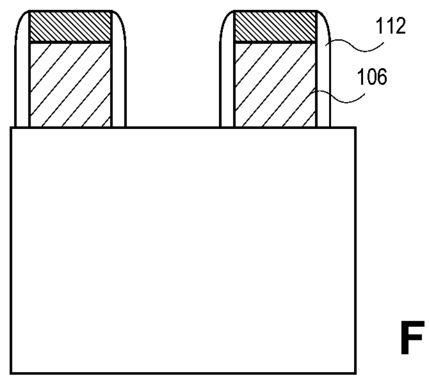
Figure 1C:
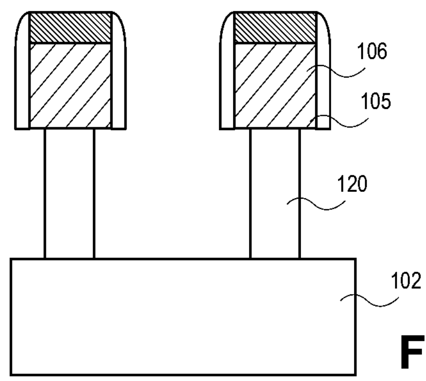
Figure 1D:
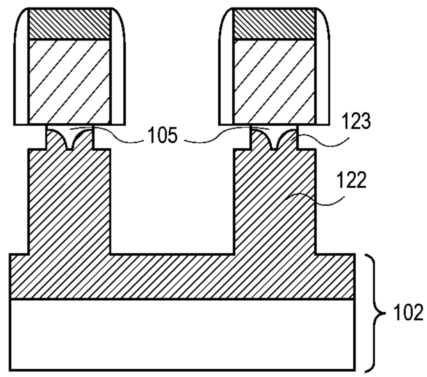
Figure 1E:
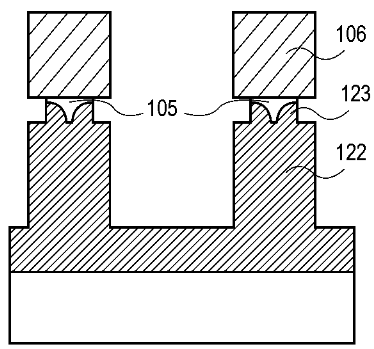
Figure 1F:
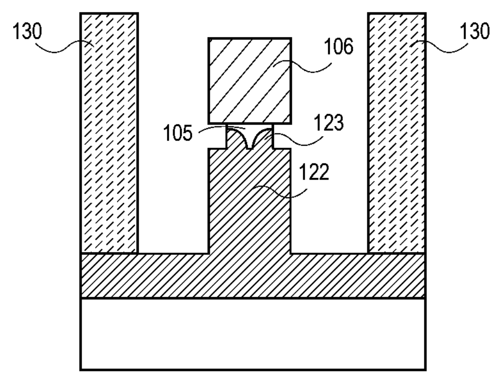
Figure 1G:
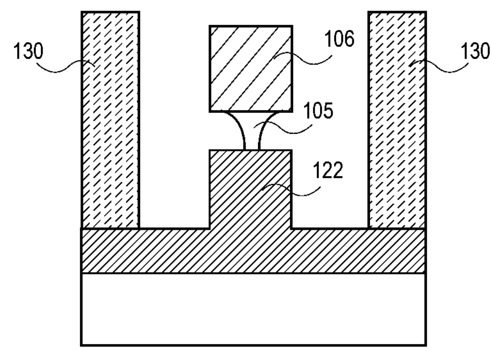
Figure 1H:
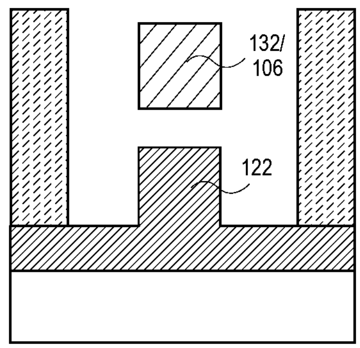
Figure 1I:
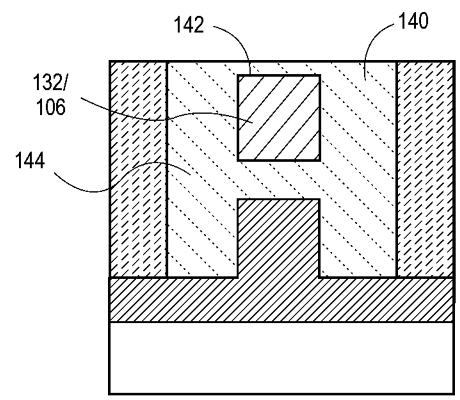
Figure 1J:
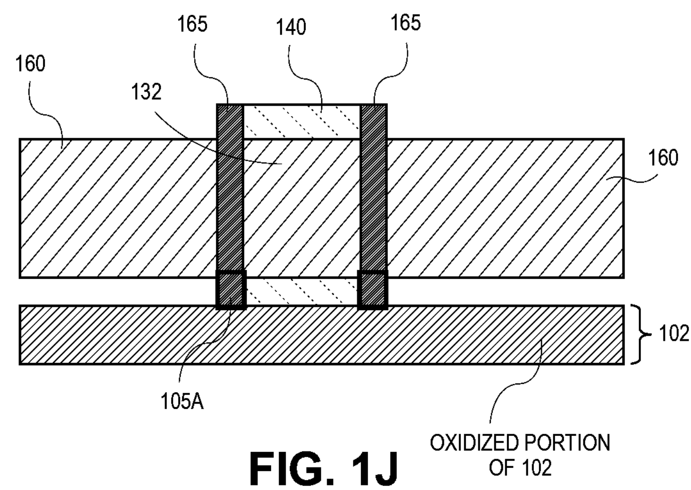
Figure 1K:
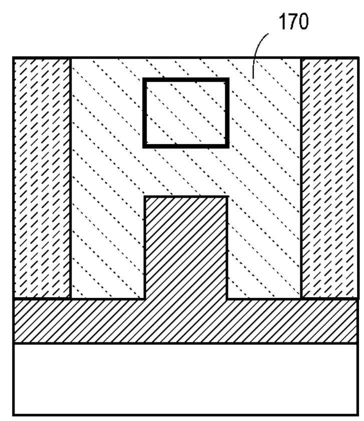

In a first example utilizing a UFO approach, FIGS. 1A-1K illustrate cross-sectional views of various operations in a method of fabricating a three-dimensional germanium-containing semiconductor device, in accordance with an embodiment of the present invention. Referring to FIG. 1A, a starting semiconductor structure 100 includes germanium-containing semiconductor bodies 106, such as germanium (Ge) or silicon germanium (SiGe) fins, disposed on a semiconductor substrate 102, such as a bulk silicon substrate. A hardmask layer 110, such as a silicon nitride hardmask layer, is disposed on the germanium-containing semiconductor bodies 106. Spacers 112, such as silicon nitride spacers are formed along the sidewalls of the germanium-containing semiconductor bodies 106, as depicted in FIG. 1B, e.g., by conformal layer deposition and etch back. Referring to FIG. 1C, exposed portions of the substrate 102 are removed to provide semiconductor pedestals 120 underneath the semiconductor bodies 106. For example, in the case that the germanium-containing semiconductor bodies 106 are protected by silicon nitride hardmask and spacers, the silicon semiconductor pedestals 120 may be formed selectively without impacting the germanium-containing semiconductor bodies 106. The semiconductor pedestals 120 are then oxidized to form isolation pedestals 122 with bird's beak portions 123, as depicted in FIG. 1D. Oxidation may also occur in the top portion of the remaining substrate 102, as is also depicted in FIG. 1D. However, oxidation at the upper portion of the semiconductor pedestals 120 is incomplete (e.g., resulting in bird's beak portions 123), leaving silicon release layer 105. Referring to FIG. 1E, the spacers and hardmask are removed to leave isolation pedestals 122/123, silicon release layer 105, and germanium-containing semiconductor bodies 106 remaining. Focusing the remainder of the description on only one germanium-containing semiconductor body 106, a dielectric pattern 130 may be formed to surround the semiconductor body 106, silicon release layer 105, and isolation pedestal 122/123, as depicted in FIG. 1F, e.g., an inter-layer dielectric (ILD) pattern. The bird's beak portions 123 of the isolation pedestal 122 are then removed, as depicted in FIG. 1G, e.g., by using an HF solution to remove the oxide. It is to be understood that a portion of the remaining isolation pedestal 122 may also be eroded. Referring to FIG. 1H, portions of the silicon release layer 105 are selectively removed to provide an entirely exposed portion 132 of the germanium-containing semiconductor body 106 above isolation pedestal 122. For example, in one embodiment, the portion of the silicon release layer 105 under the channel region of the germanium-containing semiconductor body 106 is removed, e.g., to ultimately enable formation of a gate-all-around structure. In another embodiment, the portions of the silicon release layer 105 under the source/drain regions of the germanium-containing semiconductor body 106 are removed, e.g., to ultimately enable formation of a contact-all-around structure. In another embodiment, at different stages in a process flow, the portion of the silicon release layer 105 under the channel region of the germanium-containing semiconductor body 106 is removed and the portions of the silicon release layer 105 under the source/drain regions of the germanium-containing semiconductor body 106 are removed, e.g., to ultimately enable formation of a gate-all-around and a contact-all-around structure. Using the first case as an example, a gate stack 140 is formed within the structure of FIG. 1H to provide a gate-all-around structure 140, as depicted in FIG. 1I. The gate stack 140 includes a gate dielectric layer 142 and a gate electrode 144 material surrounding the channel region 132 of the germanium-containing semiconductor body 106. At a different stage in the process flow, as depicted in FIG. 1J, the portions of the silicon release layer 105 under the source and drain regions 160 are removed to enable ultimate formation of a contact-all-around structure. Referring to FIG. 1K, in the case that the gate stack 140 is not permanent, the gate stack may be replaced with a permanent gate stack 170, such as a high-k and metal gate stack.

It is to be understood that following FIG. 1E above, different combinations of the operations shown in FIGS. 1F-1J may be selected for processing. For example, the source and drain regions of the germanium-containing semiconductor body 106 may be replaced with epitaxial regions. Also, the portions of the silicon release layer 105 under regions 160 need not be removed. Additionally, referring to FIG. 1J as an example, artifacts from processing may remain. As an example, regions 105A of the silicon release layer 105 may remain underneath gate electrode spacers 165. Overall, in a general embodiment however, FIGS. 1A-1K illustrate an exemplary process flow in which a sacrificial silicon layer is used only at the bottom of a germanium-containing fin structure. FIGS. 1J and 1K represent a comparison between the FIN cut (1J) and poly cut (1K) cross-sectional views, with the former showing the Si layer remaining under the spacer and the possibility to create a trench contact wrap around structure in the source and drain area to reduce external resistance.

Referring again to FIG. 1D, in an embodiment, the exposed portions of the semiconductor pedestals 120 are oxidized to form the isolation pedestals 122 by "under fin oxidation" (UFO). In an embodiment, the use of spacers may be required if a same or like material is being oxidized, and may even be included if non-like materials are used. In an embodiment, an oxidizing atmosphere or an adjacent oxidizing material may be used for UFO. However, in another embodiment, oxygen implant is used. In some embodiments, a portion of a material is recessed prior to UFO which may reduce the extent of so-called birds-beak formation during oxidation. Thus, the oxidation may be performed directly, by recessing first, or by oxygen implant, or a combination thereof. In another embodiment, in place of UFO, selective removal of a material at the bottom of the fin (e.g., a material that has been previously deposited on the silicon wafer before an additional fin material deposition, such as silicon germanium on a silicon substrate) is performed and replaced with a dielectric material, such as silicon dioxide or silicon nitride. In either the UFO case or the selective material removal case, the location where reoxidation or material replacement is performed can vary. For example, in one such embodiment, the reoxidation or material removal is carried out post gate etch, post spacer etch, at an undercut location, at a replacement gate operation, or at a through contact operation, or a combination thereof.

Referring again to FIG. 1H, in an embodiment, a portion of the silicon release layer 105 is etched selectively with a wet etch that selectively removes the silicon release layer 105 portion while not etching the germanium-containing body 106. Etch chemistries such as aqueous hydroxide chemistries, including ammonium hydroxide and potassium hydroxide, for example, may be utilized to selectively etch the silicon. Thus, a silicon layer may be removed from a silicon germanium or germanium fin-type structure.

Referring again to FIGS. 1F-1K, gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process comprising $SF_6$. In another embodiment, dummy gates are composed of polycrystalline silicon or amorphous silicon and are removed with a wet etch process comprising aqueous $NH_4OH$ or tetramethylammonium hydroxide. In one embodiment, dummy gates are composed of silicon nitride and are removed with a wet etch including aqueous phosphoric acid.

Figure 2A:
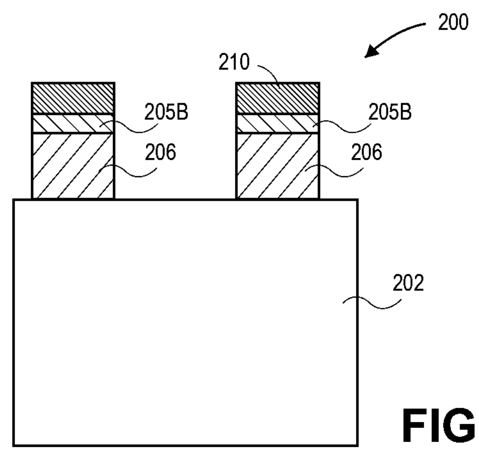
FIGS. 2A-2K illustrate cross-sectional views of various operations in another method of fabricating a semiconductor device, in accordance with an embodiment of the present invention.
Figure 2B:
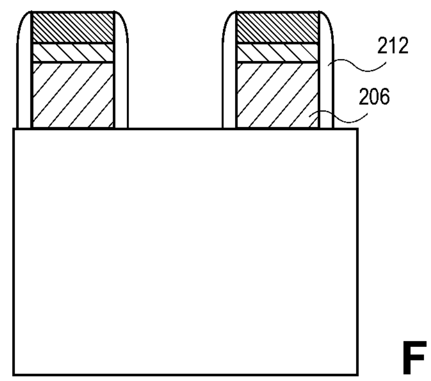
Figure 2C:
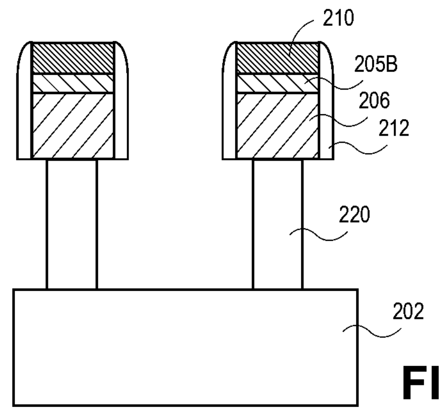
Figure 2D:
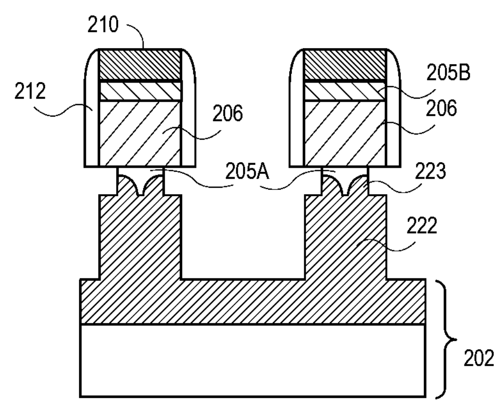
Figure 2E:
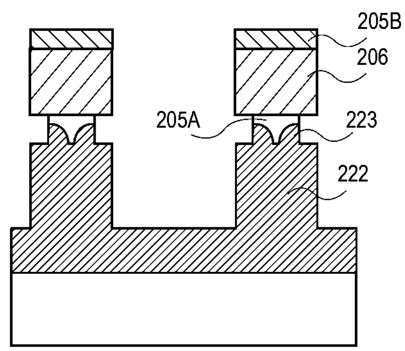
Figure 2F:
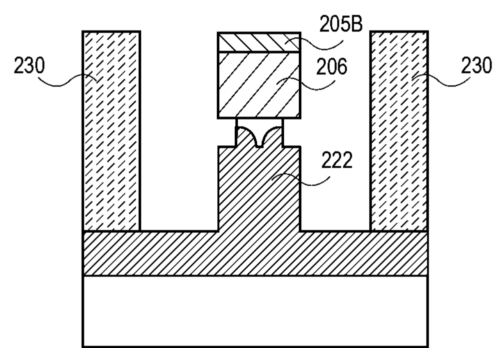
Figure 2G:
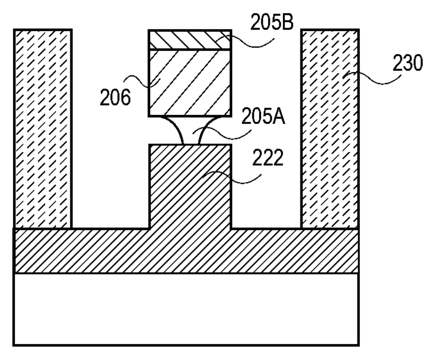
Figure 2H:
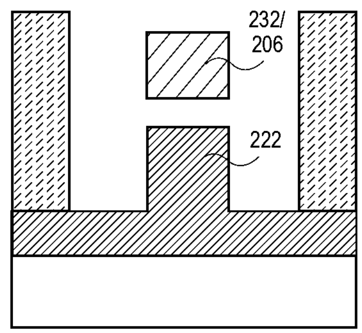
Figure 2I:
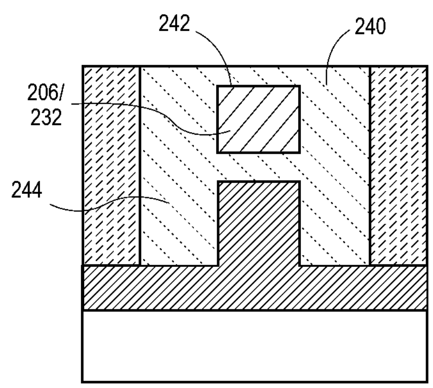
Figure 2J:
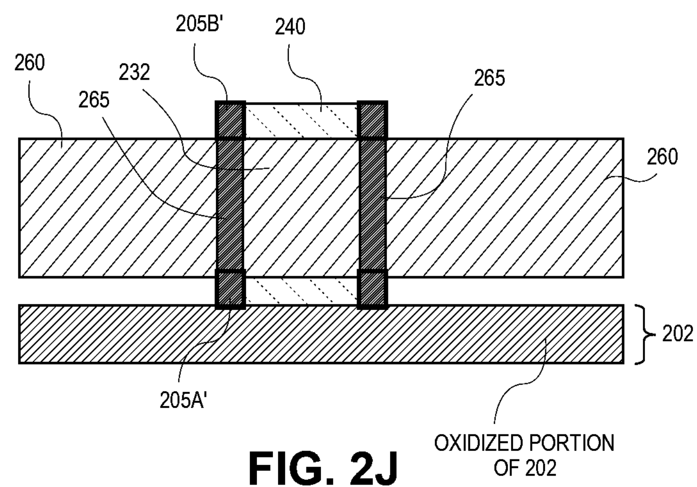
Figure 2K:
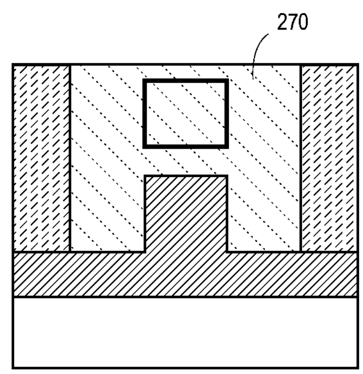

In a second example utilizing a UFO approach, FIGS. 2A-2K illustrate cross-sectional views of various operations in a method of fabricating a three-dimensional germanium-containing semiconductor device, in accordance with an embodiment of the present invention. Referring to FIG. 2A, a starting semiconductor structure 200 includes germanium-containing semiconductor bodies 206, such as germanium (Ge) or silicon germanium (SiGe) fins, disposed on a semiconductor substrate 202, such as a bulk silicon substrate. A top semiconductor release layer 205B, such as a top silicon release layer, is disposed on the germanium-containing semiconductor bodies 206. A hardmask layer 210, such as a silicon nitride hardmask layer, is disposed on the top semiconductor release layer 205B. Spacers 212, such as silicon nitride spacers are formed along the sidewalls of the germanium-containing semiconductor bodies 206, as depicted in FIG. 2B, e.g., by conformal layer deposition and etch back. Referring to FIG. 2C, exposed portions of the substrate 202 are removed to provide semiconductor pedestals 220 underneath the semiconductor bodies 206. For example, in the case that the germanium-containing semiconductor bodies 206 are protected by silicon nitride hardmask and spacers, the silicon semiconductor pedestals 220 may be formed selectively without impacting the germanium-containing semiconductor bodies 206. The semiconductor pedestals 220 are then oxidized to form isolation pedestals 222 with bird's beak portions 223, as depicted in FIG. 2D. Oxidation may also occur in the top portion of the remaining substrate 202, as is also depicted in FIG. 2D. However, oxidation at the upper portion of the semiconductor pedestals 220 is incomplete (e.g., resulting in bird's beak portions 223), leaving bottom silicon release layer 205A. Referring to FIG. 2E, the spacers and hardmask are removed to leave isolation pedestals 222/223, bottom silicon release layer 205A, top silicon release layer 205B, and germanium-containing semiconductor bodies 206 remaining. Focusing the remainder of the description on only one germanium-containing semiconductor body 206, a dielectric pattern 230 may be formed to surround the semiconductor body 206, silicon release layers 205A and 205B, and isolation pedestal 222/223, as depicted in FIG. 2F, e.g., an inter-layer dielectric (ILD) pattern. The bird's beak portions 223 of the isolation pedestal 222 are then removed, as depicted in FIG. 2G, e.g., by using an HF solution to remove the oxide. It is to be understood that a portion of the remaining isolation pedestal 222 may also be eroded. Referring to FIG. 2H, portions of the silicon release layers 205A and 205B are selectively removed to provide an entirely exposed portion 232 of the germanium-containing semiconductor body 206 above isolation pedestal 222. For example, in one embodiment, the portions of the silicon release layers 205A and 205B under and above the channel region of the germanium-containing semiconductor body 206 are removed, e.g., to ultimately enable formation of a gate-all-around structure. In another embodiment, the portions of the silicon release layers 205A and 205B under and above the source/drain regions of the germanium-containing semiconductor body 206 are removed, e.g., to ultimately enable formation of a contact-all-around structure. In another embodiment, at different stages in a process flow, the portions of the silicon release layers 205A and 205B under and above the channel region of the germanium-containing semiconductor body 206 are removed and the portions of the silicon release layers 205A and 205B under and above the source/drain regions of the germanium-containing semiconductor body 206 are removed, e.g., to ultimately enable formation of a gate-all-around and a contact-all-around structure. Using the first case as an example, a gate stack 240 is formed within the structure of FIG. 2H to provide a gate-all-around structure 240, as depicted in FIG. 2I. The gate stack 240 includes a gate dielectric layer 242 and a gate electrode 244 material surrounding the channel region 232 of the germanium-containing semiconductor body 206. At a different stage in the process flow, as depicted in FIG. 2J, the portions of the silicon release layers 205A and 205B under and above the source and drain regions 260 are removed to enable ultimate formation of a contact-all-around structure. Referring to FIG. 2K, in the case that the gate stack 240 is not permanent, the gate stack may be replaced with a permanent gate stack 270, such as a high-k and metal gate stack.

It is to be understood that following FIG. 2E above, different combinations of the operations shown in FIGS. 2F-2K may be selected for processing. For example, the source and drain regions of the germanium-containing semiconductor body 206 may be replaced with epitaxial regions. Also, the portions of the silicon release layers 205A and 205B under and above regions 260 need not be removed. Additionally, referring to FIG. 2J as an example, artifacts from processing may remain. As an example, regions 205A' and 205B' of the silicon release layers 205A and 205B may remain underneath regions of gate electrode spacers 265. Overall, in a general embodiment however, FIGS. 2A-2K illustrate an exemplary process flow in which a sacrificial silicon layer is used at both the top and the bottom of a germanium-containing fin structure. FIGS. 2J and 2K represent a comparison between the FIN cut (2J) and poly cut (2K) cross-sectional views, with the former showing the Si layer remaining under the spacer and the possibility to create a trench contact wrap around structure in the source and drain area to reduce external resistance.

Figure 3A:
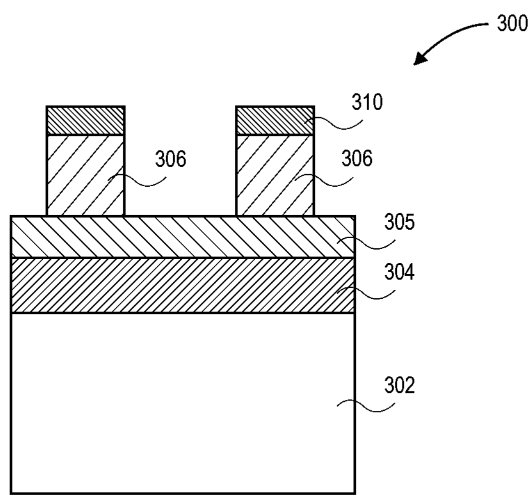
FIGS. 3A-3G illustrate cross-sectional views of various operations in another method of fabricating a semiconductor device, in accordance with an embodiment of the present invention.
Figure 3B:
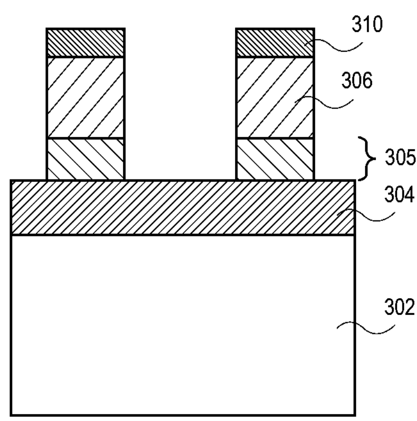
Figure 3C:
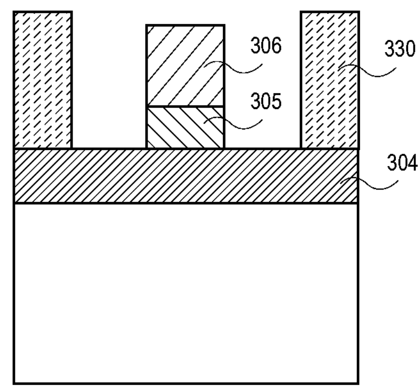
Figure 3D:
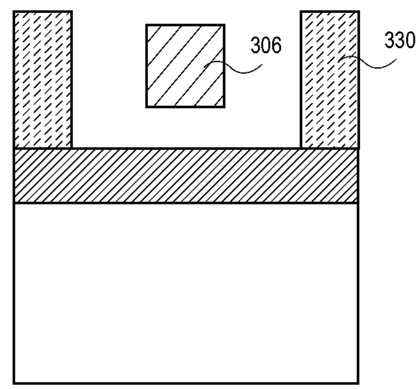
Figure 3E:
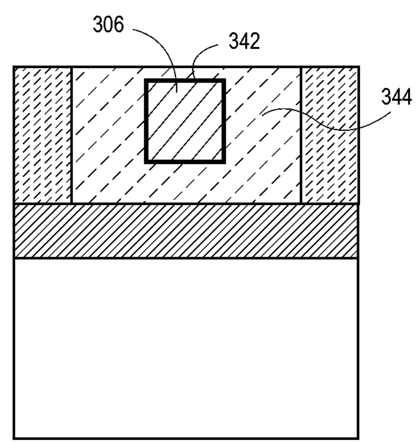
Figure 3F:
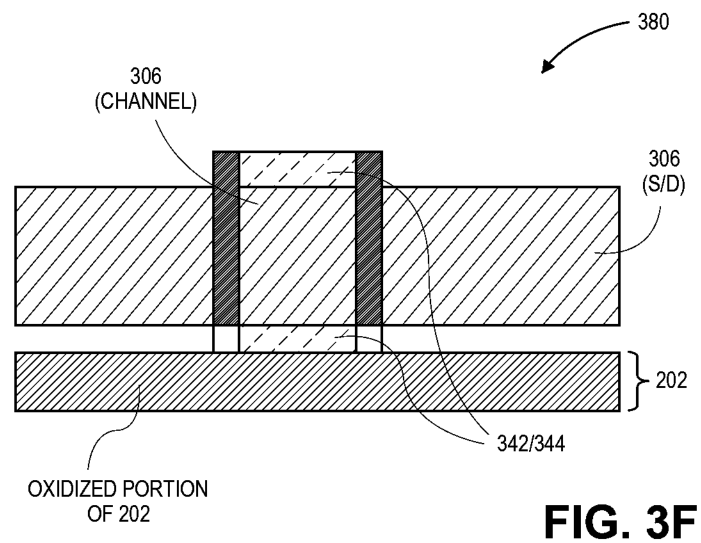
Figure 3G:
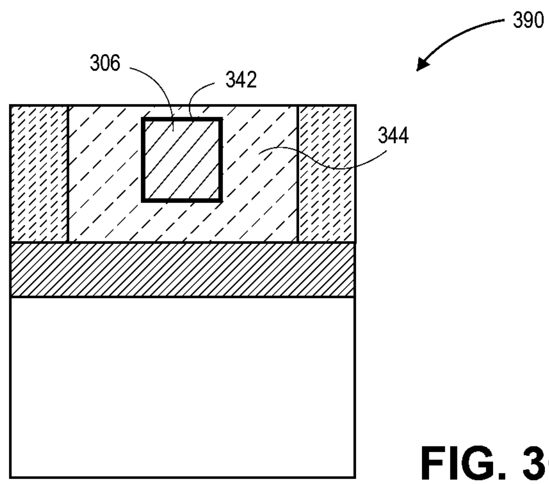

In an example utilizing already-formed buried oxide approach, FIGS. 3A-3G illustrate cross-sectional views of various operations in another method of fabricating a semiconductor device, in accordance with an embodiment of the present invention. Referring to FIG. 3A, a starting semiconductor structure 300 includes germanium-containing semiconductor bodies 306, such as silicon germanium or germanium fins, disposed on a semiconductor release layer 305, such as a silicon release layer. The silicon release layer 305 is disposed on an insulating layer 304, such as a buried $SiO_2$ layer of a silicon-on-insulator (SOI) substrate. The insulating layer 304 is disposed on a substrate 302, such as a silicon substrate. A hardmask layer 310, such as a silicon nitride hardmask layer, is disposed on the germanium-containing semiconductor bodies 306. The silicon release layer 305 is patterned to expose insulating layer 304, as depicted in FIG. 3B, e.g., by a dry etch process. Focusing the remainder of the description on only one germanium-containing semiconductor body 306, the hardmask 310 is removed and a dielectric pattern 330 is formed to surround the germanium-containing semiconductor body 306 and silicon release layer 305, as depicted in FIG. 3C, e.g., an inter-layer dielectric (ILD) pattern. Although not depicted in FIG. 3C, source and drain replacement and/or a replacement gate process may also be performed at, prior to or after, this stage. Referring to FIG. 3D, the silicon release layer 305 (and top silicon release layer if present, such as described in association with FIGS. 2A-2K) is removed. Then, a gate dielectric layer 342 and metal gate electrode 344 may be formed, as depicted in FIG. 3E. Referring to FIGS. 3F and 3G (latter is repeat of FIG. 3E), respectively, a comparison between the FIN cut 380 and poly cut 390 views is provided. In the former view, the possibility to fabricate a trench contact wrap-around is available in the source and drain (S/D) regions. Other features may be as described above in association with FIGS. 1J/1K and 2J/2K.

It is to be understood that additional wire structures (such as those described below in association with FIGS. 4A-4C) may also be fabricated in association with the fin structures described and illustrated in FIGS. 1A-1K, 2A-2K and 3A-3G above. As an example, FIG. 4A illustrates a three-dimensional cross-sectional view of a nanowire-based semiconductor structure, in accordance with an embodiment of the present invention. FIG. 4B illustrates a cross-sectional channel view of the nanowire-based semiconductor structure of FIG. 4A, as taken along the a-a' axis. FIG. 4C illustrates a cross-sectional spacer view of the nanowire-based semiconductor structure of FIG. 4A, as taken along the b-b' axis.

Referring to FIG. 4A, a semiconductor device 400 includes one or more vertically stacked nanowires (404 set) disposed above a substrate 402. Embodiments herein are targeted at both single wire devices and multiple wire devices. As an example, a three nanowire-based devices having nanowires 404A, 404B and 404C is shown for illustrative purposes. For convenience of description, nanowire 404A is used as an example where description is focused on only one of the nanowires. It is to be understood that where attributes of one nanowire are described, embodiments based on a plurality of nanowires may have the same attributes for each of the nanowires.

Each of the nanowires 404 includes a germanium-containing channel region 406 disposed in the nanowire. The germanium-containing channel region 406 has a length (L). Referring to FIG. 4B, the germanium-containing channel region also has a perimeter orthogonal to the length (L). Referring to both FIGS. 4A and 4B, a gate electrode stack 408 surrounds the entire perimeter of each of the germanium-containing channel regions 406 of nanowires 404C and 404B. In one embodiment, a semiconductor release layer 490 portion (described in greater detail above) is not present under the germanium-containing channel region 406 of nanowire 404A, and the device 400 is thus a gate-all-around device with respect to the first nanowire 404A. In another embodiment, however, the semiconductor release layer 490 portion is present under the germanium-containing channel region 406 of nanowire 404A, and the device 400 is thus not a gate-all-around device with respect to the first nanowire 404A. The gate electrode stack 408 includes a gate electrode along with a gate dielectric layer disposed between the germanium-containing channel region 406 and the gate electrode (not shown).

Referring again to FIG. 4A, each of the nanowires 404 also includes source and drain regions 410 and 412, possibly germanium-containing source and drain regions, disposed in the nanowire on either side of the germanium-containing channel region 406. A pair of contacts 414 is disposed over the source/drain regions 410/412. Referring to both FIGS. 4A and 4B, the pair of contacts 414 is disposed over the source/drain regions 410/412. In one embodiment, a semiconductor release layer 490 portion (described in greater detail above) is not present under the source or drain region 410 or 412 of nanowire 404A, and the device 400 is thus a contact-all-around device with respect to the first nanowire 404A. In another embodiment, however, the semiconductor release layer 490 portion is present under the source or drain region 410 or 412 of nanowire 404A, and the device 400 is thus not a contact-all-around device with respect to the first nanowire 404A.

Referring again to FIG. 4A, in an embodiment, the semiconductor device 400 further includes a pair of spacers 416. The spacers 416 are disposed between the gate electrode stack 408 and the pair of contacts 414. As described above, the germanium-containing channel regions and the source/drain regions are, in at least several embodiments, made to be discrete. However, not all regions of the nanowires 404 need be, or even can be made to be discrete. For example, referring to FIG. 4C, nanowires 404A-404C are not discrete at the location under spacers 416. In one embodiment, the stack of nanowires 404A-404C have intervening semiconductor material 418 there between, such as silicon intervening between silicon germanium or germanium nanowires, or vice versa. In one embodiment, the bottom nanowire 404A is still in contact with a semiconductor release layer 490 portion. Thus, in an embodiment, a portion of the plurality of vertically stacked nanowires under one or both of the spacers is non-discrete.

The semiconductor release layer 490 may be a layer (or remnants thereof) such as the release layer 105/205/305 described above. In one embodiment, the semiconductor release layer 490 is composed of silicon and the overlying nanowire 404A is composed of silicon germanium or germanium. In an embodiment, portions of the semiconductor release layer 490 are removed under the germanium-containing channel region of nanowire 404A and a gate-all-around structure may be formed. In an embodiment, portions of the semiconductor release layer 490 are removed under the source and drain regions of nanowire 404A and a contact-all-around structure may be formed. In an embodiment, portions of the semiconductor release layer 490 are removed under the channel and the source and drain regions of nanowire 404A and both a gate-all-around structure and a contact-all-around structure may be formed.

In accordance with an embodiment of the present invention, the one or more nanowires 404A-404C of the semiconductor device 400 are uniaxially strained nanowires. Thus, a semiconductor device may be fabricated from a single uniaxially strained nanowire (e.g., 404A) or from a plurality of vertically stacked uniaxially strained nanowires (404A-404C), as depicted in FIG. 4A. The uniaxially strained nanowire or plurality of nanowires may be uniaxially strained with tensile strain or with compressive strain. In an embodiment, a compressively uniaxially strained nanowire has a channel region composed of silicon germanium ($Si_xGe_y$, where $0<x<100$, and $0<y<100$) or germanium. In an embodiment, a PMOS semiconductor device is fabricated from a nanowire having the uniaxial compressive strain.

Referring to FIGS. 4A-4C, the semiconductor device 400 further includes a dielectric layer 430 disposed between a bulk substrate 402 and the nanowires 404A-404C. In an embodiment, the dielectric layer 430 is effectively continuous across a substrate 402 and is a global insulating layer. In one embodiment, the dielectric layer 430 is composed of a dielectric material such as, but not limited to, silicon dioxide, silicon oxy-nitride or silicon nitride. In another embodiment, the nanowires 404A-404C are isolated from a bulk substrate 402 by an isolation pedestal, e.g., they are locally isolated. The isolation pedestal may be composed of a material suitable to electrically isolate at least a portion, if not all, of the nanowire 404A from the bulk substrate 402. For example, in one embodiment, the isolation pedestal is composed of a dielectric material such as, but not limited to, silicon dioxide, silicon oxy-nitride or silicon nitride. In an embodiment, the isolation pedestal is composed of an oxide of the semiconductor material of the bulk substrate 402.

In an embodiment, the term "isolation pedestal" is used to covey a discrete isolation structure formed at a given time, e.g., a discrete structure formed only under a channel region, or a pair of discrete structures formed only under a pair of source and drain regions, or a discrete structure formed under a channel region as well as under a pair of source and drain regions. In another embodiment, the term "isolation pedestal" is used to covey a combination of isolation structures formed at different times, e.g., a discrete structure formed under a channel region in combination with a pair of discrete structures formed, at a different time, under a pair of source and drain regions.

Bulk substrate 402 may be composed of a semiconductor material that can withstand a manufacturing process. In an embodiment, bulk substrate 402 is composed of a crystalline silicon, silicon/germanium or germanium layer doped with a charge carrier, such as but not limited to phosphorus, arsenic, boron or a combination thereof. In one embodiment, the concentration of silicon atoms in bulk substrate 402 is greater than 97%. In another embodiment, bulk substrate 402 is composed of an epitaxial layer grown atop a distinct crystalline substrate, e.g. a silicon epitaxial layer grown atop a boron-doped bulk silicon mono-crystalline substrate. Bulk substrate 402 may alternatively be composed of a group III-V material. In an embodiment, bulk substrate 402 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 402 is composed of a III-V material and the charge-carrier dopant impurity atoms are ones such as, but not limited to, carbon, silicon, germanium, oxygen, sulfur, selenium or tellurium. In another embodiment, bulk substrate 402 is undoped or only lightly doped.

In an embodiment, the gate electrode of gate electrode stack 408 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the outer few layers of the semiconductor nanowires 404A-404C. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

The contacts 416 are, in an embodiment, fabricated from a metal species. The metal species may be a pure metal, such as nickel or cobalt, or may be an alloy such as a metal-metal alloy or a metal-semiconductor alloy (e.g., such as a silicide material). In an embodiment, spacers 416 are composed of an insulative dielectric material such as, but not limited to, silicon dioxide, silicon oxy-nitride or silicon nitride.

Semiconductor device 400 may be any semiconductor device incorporating a gate, one or more channel regions and one or more pairs of source/drain regions. In an embodiment, semiconductor device 400 is one such as, but not limited to, a MOS-FET, a memory transistor, or a Microelectromechanical System (MEMS). In one embodiment, semiconductor device 400 is a three-dimensional MOS-FET and is a stand-alone device or is one device in a plurality of nested devices. As will be appreciated for a typical integrated circuit, both N- and P-channel transistors may be fabricated on a single substrate to form a CMOS integrated circuit.

Although the device 400 described above is for a single device, e.g., an NMOS or a PMOS device, a CMOS architecture may also be formed to include both NMOS and PMOS channel devices disposed on or above the same substrate. A plurality of such NMOS devices, however, may be fabricated to have different semiconductor body heights and/or may be isolated from or coupled to an underlying bulk substrate. Likewise, a plurality of such PMOS devices may be fabricated to have different semiconductor body heights and/or may be isolated from or coupled to an underlying bulk substrate. Furthermore, additional processing not shown may include processing operations such as back-end interconnect formation and semiconductor die packaging.

A CMOS architecture may also be formed to include both NMOS and PMOS nanowire-based devices disposed on or above the same substrate. Nanowire/nanoribbon structure may be formed by selective etching of sacrificial layers from multilayer epitaxial stacks. The epitaxial layers may be used as a channel or may be selectively removed to form a gap for all-around gate structure. The isolation layer under epitaxial wires may provide electrical isolation and form a bottom gap for all-around gate. The simplest CMOS integration scheme employs N/P MOS channels fabricated with the same material. The process is simpler to fabricate in that it employs a single selective etch. However, strain technology may be required to boost device performance. In accordance with an embodiment of the present invention, the unique features of a starting material stack are exploited to integrate different NMOS and PMOS channel materials which are optimized for higher mobility. For example, in one embodiment, a sacrificial layer of an NMOS device is used as a PMOS channel and a sacrificial layer of a PMOS device is used as an NMOS channel. Since the sacrificial layer may be removed during processing, independent choice of channel materials and optimization is made possible.

In general, one or more embodiments described herein can be implemented improve performance on, e.g., 14 nanometer and smaller node products and reduce standby leakage. Standby leakage reduction may be particularly important for system-on-chip (SOC) products with extremely stringent standby power requirements. Furthermore, other or the same embodiments may take advantage of higher mobility properties of channel material engineering using SiGe or Ge a hole carrier channel material. Also, the gate-all-around and/or contact-all-around structures are expected to improve short channel performance and transistor contact resistance.

One or more embodiments of the present invention are directed at improving the channel mobility for PMOS transistors. Mobility may be improved using a germanium-containing semiconductor material, e.g., in the channel region. Thus, one or more approaches described herein provide the appropriate high mobility material in the channel regions for PMOS transistors. In an embodiment, germanium-containing PMOS gate-all-around devices are provided.

Figure 5:
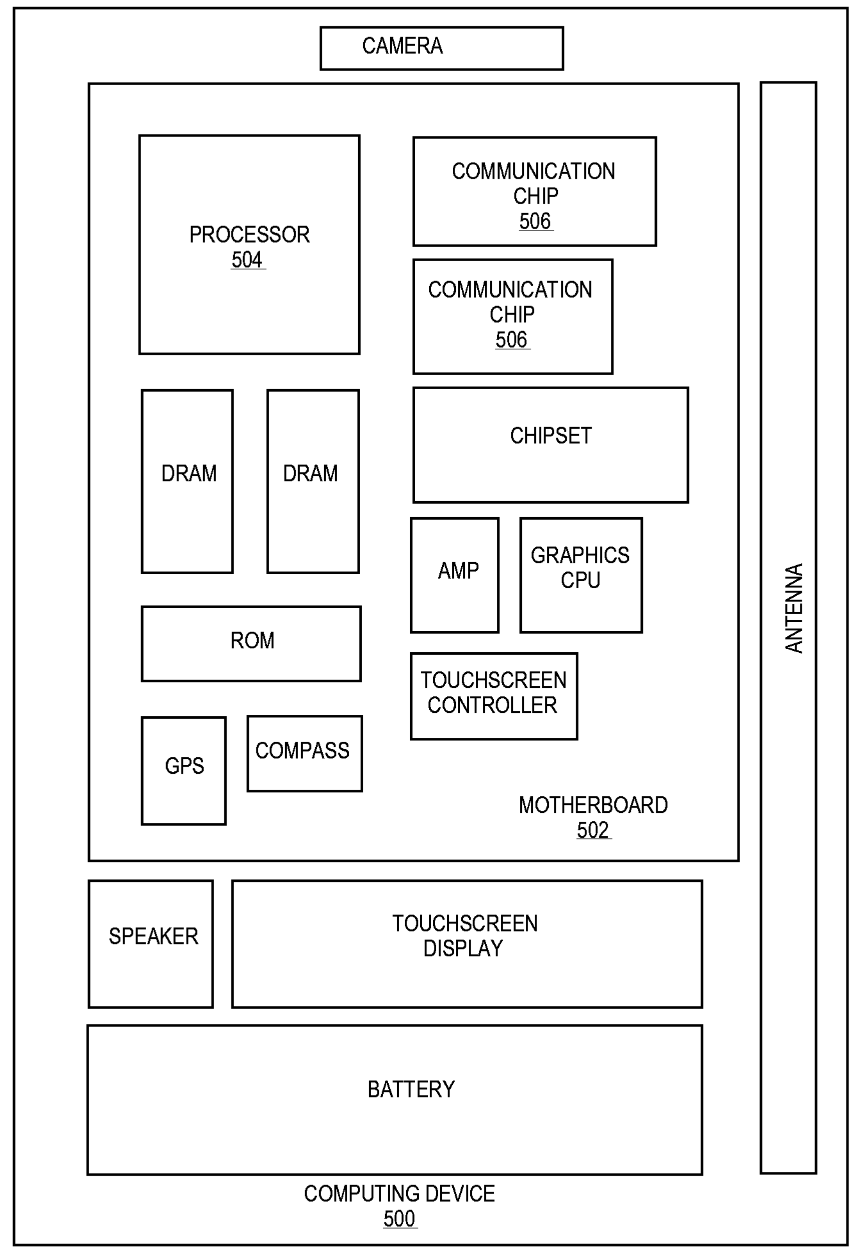
FIG. 5 illustrates a computing device in accordance with one implementation of an embodiment of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Thus, embodiments of the present invention include three-dimensional germanium-based semiconductor devices formed on globally or locally isolated substrates.

In an embodiment, a semiconductor device includes a semiconductor substrate. An insulating structure is disposed above the semiconductor substrate. A three-dimensional germanium-containing body is disposed on a semiconductor release layer disposed on the insulating structure. The three-dimensional germanium-containing body includes a channel region and source/drain regions on either side of the channel region. The semiconductor release layer is under the source/drain regions but not under the channel region. The semiconductor release layer is composed of a semiconductor material different from the three-dimensional germanium-containing body. A gate electrode stack surrounds the channel region with a portion disposed on the insulating structure and laterally adjacent to the semiconductor release layer.

In one embodiment, the insulating structure includes a global insulating layer.

In one embodiment, the insulating structure includes one or more isolation pedestals.

In one embodiment, the semiconductor release layer is composed essentially entirely of silicon, and the three-dimensional germanium-containing body is composed of greater than approximately 50% germanium.

In one embodiment, the three-dimensional germanium-containing body is composed of greater than approximately 70% germanium.

In one embodiment, the semiconductor structure further includes a pair of insulating spacers. One spacer is disposed between the gate electrode and the source region. The other spacer is disposed between the gate electrode and the drain region. The semiconductor release layer extends underneath each of the pair of spacers.

In one embodiment, the semiconductor structure further includes a pair of conducting contacts. One contact is disposed on and partially surrounds the source region. The other contact is disposed on and partially surrounds the drain region.

In one embodiment, the semiconductor structure further includes one or more nanowires disposed in a vertical arrangement above the three-dimensional germanium-containing body. The gate electrode stack surrounds a channel region of each of the one or more nanowires.

In one embodiment, the gate electrode stack includes a high-k gate dielectric layer and a metal gate electrode.

In an embodiment, a semiconductor device includes a semiconductor substrate. An insulating structure is disposed above the semiconductor substrate. A three-dimensional germanium-containing body is disposed on a semiconductor release layer disposed on the insulating structure. The three-dimensional germanium-containing body includes a channel region and source/drain regions on either side of the channel region. The semiconductor release layer is under the channel region but not under the source/drain regions. The semiconductor release layer is composed of a semiconductor material different from the three-dimensional germanium-containing body. A gate electrode stack partially surrounds the channel region. A pair of conducting contacts is included. One contact is disposed on and surrounds the source region. The other contact is disposed on and surrounds the drain region. A portion of each of the pair of contacts is disposed on the insulating structure and laterally adjacent to the semiconductor release layer.

In one embodiment, the insulating structure includes a global insulating layer.

In one embodiment, the insulating structure includes one or more isolation pedestals.

In one embodiment, the semiconductor release layer is composed essentially of silicon. The three-dimensional germanium-containing body is composed of greater than approximately 50% germanium.

In one embodiment, the three-dimensional germanium-containing body is composed of greater than approximately 70% germanium.

In one embodiment, the semiconductor structure further includes a pair of insulating spacers. One spacer is disposed between the gate electrode and the source region. The other spacer is disposed between the gate electrode and the drain region. The semiconductor release layer extends underneath each of the pair of spacers.

In one embodiment, the semiconductor structure further includes one or more nanowires disposed in a vertical arrangement above the three-dimensional germanium-containing body. The gate electrode stack surrounds a channel region of each of the one or more nanowires.

In one embodiment, the gate electrode stack includes a high-k gate dielectric layer and a metal gate electrode.

In an embodiment, a semiconductor device includes a semiconductor substrate. An insulating structure is disposed above the semiconductor substrate. A three-dimensional germanium-containing body is disposed on a semiconductor release layer disposed on the insulating structure. The three-dimensional germanium-containing body includes a channel region and source/drain regions on either side of the channel region. The semiconductor release layer is not under the channel region and not under the source/drain regions. The semiconductor release layer is composed of a semiconductor material different from the three-dimensional germanium-containing body. A gate electrode stack surrounds the channel region with a portion disposed on the insulating structure. A pair of conducting contacts is included. One contact is disposed on and surrounds the source region. The other contact is disposed on and surrounds the drain region. A portion of each of the pair of contacts is disposed on the insulating structure. A pair of insulating spacers is included. One spacer is disposed between the gate electrode and the source region. The other spacer is disposed between the gate electrode and the drain region. The semiconductor release layer is disposed underneath each of the pair of spacers and laterally adjacent to a portion of the gate electrode stack and a portion of each of the conducting contacts.

In one embodiment, the insulating structure includes a global insulating layer.

In one embodiment, the insulating structure includes one or more isolation pedestals.

In one embodiment, the semiconductor release layer is composed essentially of silicon. The three-dimensional germanium-containing body is composed of greater than approximately 50% germanium.

In one embodiment, the three-dimensional germanium-containing body is composed of greater than approximately 70% germanium.

In one embodiment, the semiconductor structure further includes one or more nanowires disposed in a vertical arrangement above the three-dimensional germanium-containing body. The gate electrode stack surrounds a channel region of each of the one or more nanowires.

In one embodiment, the gate electrode stack includes a high-k gate dielectric layer and a metal gate electrode.

In an embodiment, a method of fabricating a semiconductor device includes forming a three-dimensional germanium-containing semiconductor structure on semiconductor release layer disposed above a semiconductor substrate. The semiconductor release layer is composed of a semiconductor material different from the three-dimensional germanium-containing semiconductor structure. The method also includes insulating the three-dimensional germanium-containing semiconductor structure from the semiconductor substrate. The method also includes, subsequently, removing a portion of the semiconductor release layer. The method also includes forming a gate electrode stack at least partially surrounding a channel region of the three-dimensional germanium-containing semiconductor structure. The method also includes forming a pair of conducting contacts, one contact at least partially surrounding a source region of the three-dimensional germanium-containing semiconductor structure, and the other contact at least partially surrounding a drain region of the three-dimensional germanium-containing semiconductor structure.

In one embodiment, insulating the three-dimensional germanium-containing semiconductor structure includes providing a global insulating layer on the semiconductor substrate.

In one embodiment, insulating the three-dimensional germanium-containing semiconductor structure includes forming one or more isolation pedestals.

In one embodiment, forming the gate electrode stack includes using a replacement gate process. In one embodiment, removing the portion of the semiconductor release layer includes removing a portion between the channel region and the semiconductor substrate, and the gate electrode stack surrounds the channel region.

In one embodiment, removing the portion of the semiconductor release layer includes removing a portion between the source and drain regions and the semiconductor substrate, and the one contact surrounds the source region and the other contact surrounds the drain region.

What is claimed is:

1. A semiconductor device, comprising:
- a semiconductor substrate;
- an insulating structure disposed above the semiconductor substrate;
- a semiconductor release layer disposed over and directly on the insulating structure;
- a three-dimensional germanium-containing body disposed on the semiconductor release layer, the three-dimensional germanium-containing body comprising a channel region and source/drain regions on either side of the channel region, wherein the semiconductor release layer is under the source/drain regions but not under the channel region, the semiconductor release layer comprising a semiconductor material different from the three-dimensional germanium-containing body; and
- a gate electrode stack surrounding the channel region with a portion disposed on the insulating structure directly below the channel region, and laterally adjacent to the semiconductor release layer.

2. The semiconductor device of claim 1, wherein the insulating structure comprises a global insulating layer.

3. The semiconductor device of claim 1, wherein the insulating structure comprises one or more isolation pedestals.

4. The semiconductor structure of claim 1, wherein the semiconductor release layer consists essentially of silicon, and wherein the three-dimensional germanium-containing body comprises greater than approximately 50% germanium.

5. The semiconductor structure of claim 4, wherein the three-dimensional germanium-containing body comprises greater than approximately 70% germanium.

6. The semiconductor structure of claim 1, further comprising:
- a pair of insulating spacers, one spacer disposed between the gate electrode and the source region, and the other spacer disposed between the gate electrode and the drain region, wherein the semiconductor release layer extends underneath each of the pair of spacers.

7. The semiconductor structure of claim 1, further comprising:
- a pair of conducting contacts, one contact disposed on and partially surrounding the source region, and the other contact disposed on and partially surrounding the drain region.

8. The semiconductor structure of claim 1, further comprising:
- one or more nanowires disposed in a vertical arrangement above the three-dimensional germanium-containing body, wherein the gate electrode stack surrounds a channel region of each of the one or more nanowires.

9. The semiconductor structure of claim 1, wherein the gate electrode stack comprises a high-k gate dielectric layer and a metal gate electrode.

10. A semiconductor device, comprising:
- a semiconductor substrate;
- an insulating structure disposed above the semiconductor substrate;
- a semiconductor release layer disposed over and directly on the insulating structure;
- a three-dimensional germanium-containing body disposed on the semiconductor release layer, the three-dimensional germanium-containing body comprising a channel region and source/drain regions on either side of the channel region, wherein the semiconductor release layer is under the channel region but not under the source/drain regions, the semiconductor release layer comprising a semiconductor material different from the three-dimensional germanium-containing body;
- a gate electrode stack partially surrounding the channel region; and
- a pair of conducting contacts, one contact disposed on and surrounding the source region, and the other contact disposed on and surrounding the drain region, wherein a portion of each of the pair of contacts is disposed on the insulating structure directly below the channel region, and laterally adjacent to the semiconductor release layer.

11. The semiconductor device of claim 10, wherein the insulating structure comprises a global insulating layer.

12. The semiconductor device of claim 10, wherein the insulating structure comprises one or more isolation pedestals.

13. The semiconductor structure of claim 10, wherein the semiconductor release layer consists essentially of silicon, and wherein the three-dimensional germanium-containing body comprises greater than approximately 50% germanium.

14. The semiconductor structure of claim 13, wherein the three-dimensional germanium-containing body comprises greater than approximately 70% germanium.

15. The semiconductor structure of claim 10, further comprising:
- a pair of insulating spacers, one spacer disposed between the gate electrode and the source region, and the other spacer disposed between the gate electrode and the drain region, wherein the semiconductor release layer extends underneath each of the pair of spacers.

16. The semiconductor structure of claim 10, further comprising:
- one or more nanowires disposed in a vertical arrangement above the three-dimensional germanium-containing body, wherein the gate electrode stack surrounds a channel region of each of the one or more nanowires.

17. The semiconductor structure of claim 10, wherein the gate electrode stack comprises a high-k gate dielectric layer and a metal gate electrode.

18. A semiconductor device, comprising:

a semiconductor substrate;

an insulating structure disposed above the semiconductor substrate;

a semiconductor release layer disposed over and directly on the insulating structure;

a three-dimensional germanium-containing body disposed on the semiconductor release layer, the three-dimensional germanium-containing body comprising a channel region and source/drain regions on either side of the channel region, wherein the semiconductor release layer is not under the channel region and not under the source/drain regions, the semiconductor release layer comprising a semiconductor material different from the three-dimensional germanium-containing body;

a gate electrode stack surrounding the channel region with a portion disposed on the insulating structure directly below the channel region;

a pair of conducting contacts, one contact disposed on and surrounding the source region, and the other contact disposed on and surrounding the drain region, wherein a portion of each of the pair of contacts is disposed on the insulating structure; and a pair of insulating spacers, one spacer disposed between the gate electrode and the source region, and the other spacer disposed between the gate electrode and the drain region, wherein the semiconductor release layer is disposed underneath each of the pair of spacers and laterally adjacent to a portion of the gate electrode stack and a portion of each of the conducting contacts.

19. The semiconductor device of claim 18, wherein the insulating structure comprises a global insulating layer.

20. The semiconductor device of claim 18, wherein the insulating structure comprises one or more isolation pedestals.

21. The semiconductor structure of claim 18, wherein the semiconductor release layer consists essentially of silicon, and wherein the three-dimensional germanium-containing body comprises greater than approximately 50% germanium.

22. The semiconductor structure of claim 21, wherein the three-dimensional germanium-containing body comprises greater than approximately 70% germanium.

23. The semiconductor structure of claim 18, further comprising:

one or more nanowires disposed in a vertical arrangement above the three-dimensional germanium-containing body, wherein the gate electrode stack surrounds a channel region of each of the one or more nanowires.

24. The semiconductor structure of claim 18, wherein the gate electrode stack comprises a high-k gate dielectric layer and a metal gate electrode.

* * * * *